(12) United States Patent
Zeng et al.

(10) Patent No.: US 12,017,213 B2
(45) Date of Patent: Jun. 25, 2024

(54) DEVICE AND METHOD FOR DIRECT PRINTING OF MICROFLUIDIC CHIP BASED ON LARGE-FORMAT ARRAY FEMTOSECOND LASER

(71) Applicants: Chongqing Institute of East China Normal University, Chongqing (CN); SHANGHAI LANGYAN OPTOELECTRONICS TECHNOLOGY CO., LTD., Shanghai (CN); East China Normal University, Shanghai (CN)

(72) Inventors: Heping Zeng, Chongqing (CN); Chuan Yang, Chongqing (CN); Mengyun Hu, Shanghai (CN); Shuai Yuan, Chongqing (CN)

(73) Assignees: Chongqing Institute of East China Normal University, Chongqing (CN); SHANGHAI LANGYAN OPTOELECTRONICS TECHNOLOGY CO., LTD., Shanghai (CN); East China Normal University, Shanghai (CN)

( * ) Notice: Subject to any disclaimer, the term of this patent is extended or adjusted under 35 U.S.C. 154(b) by 645 days.

(21) Appl. No.: 17/336,222

(22) Filed: Jun. 1, 2021

(65) Prior Publication Data
US 2021/0299658 A1 Sep. 30, 2021

(51) Int. Cl.
*B01L 3/00* (2006.01)
*B23K 26/03* (2006.01)
*B23K 26/06* (2014.01)
*B81C 1/00* (2006.01)
*G06F 30/3308* (2020.01)

(52) U.S. Cl.
CPC ...... *B01L 3/502707* (2013.01); *B23K 26/032* (2013.01); *B23K 26/0643* (2013.01); *B81C 1/00119* (2013.01); *B81C 1/00539* (2013.01); *G06F 30/3308* (2020.01)

(58) Field of Classification Search
CPC .......... B01L 3/502707; B23K 26/032; B23K 26/0624; B23K 26/0643; B23K 26/0676; B23K 26/36; B81C 1/00119; B81C 1/00539; G06F 30/3308
See application file for complete search history.

(56) References Cited

FOREIGN PATENT DOCUMENTS

| CN | 106102899 A | * | 11/2016 | ............. B23K 26/06 |
|---|---|---|---|---|
| CN | 109022246 A | * | 12/2018 | ........ B01L 3/502707 |
| CN | 109317228 A | | 2/2019 | |
| CN | 106975526 B | * | 8/2019 | ............ B01L 3/5027 |
| CN | 111408856 A | | 7/2020 | |

* cited by examiner

*Primary Examiner* — Jennifer Wecker

(57) ABSTRACT

A device and a method for direct printing of a microfluidic chip based on a large-format array femtosecond laser. The large-format array femtosecond laser with multi-parameter adjustable laser beam state is used to achieve large-format laser interference. The interference state, interference combination and exposure mode of the large-format array femtosecond laser are regulated, and multiple exposures are superimposed to output the desired pattern for the microfluidic chip, enabling the direct printing processing of the microfluidic chip.

20 Claims, 10 Drawing Sheets

DEVICE AND METHOD FOR DIRECT PRINTING OF MICROFLUIDIC CHIP BASED ON LARGE-FORMAT ARRAY FEMTOSECOND LASER

CROSS-REFERENCE TO RELATED APPLICATIONS

This application claims the benefit of priority from Chinese Patent Application No. 202010863837.4, filed on Aug. 25, 2020. The content of the aforementioned application, including any intervening amendments thereto, is incorporated herein by reference in its entirety.

TECHNICAL FIELD

The present application relates to processing technologies of microfluidic chip, and more particularly to a device and a method for direct printing of a microfluidic chip based on a large-format array femtosecond laser.

BACKGROUND

With the development of miniaturization, integration and intelligence, the microfluidic chip technology is developed and improved, in which the experimental and analysis processes that need to be performed in traditional laboratories are integrated on a centimeter-sized chip to enable the systematic analysis and detection in the fields such as biology, chemistry and medicine. In order to manufacture a micro-channel structure of microfluidic chips with micro-size, high precision, complex structure, and true three-dimensionality to enable the integrated analysis and detection process and the microfluidic flow of reagents, it is required to optimize the processing technology of microfluidic chips. Traditional processing methods of microfluidic chips, such as molding, hot pressing and photolithography process, are often limited to the manufacturing of a surface two-dimensional micro-channel structure, which is usually needed to be sealed to form a microfluidic chip. Moreover, these methods also have limitations in materials.

Due to the features of non-thermal melting property, high accuracy, three-dimensional spatial resolution, low energy consumption, and sub-micron or even nano-level processing sizes, the femtosecond laser processing technology has been widely adopted in the processing of various materials, and it has now been extensively studied and applied in the micro-nano processing. The femtosecond laser can be used to process the micro-channels of the microfluidic chip and the microfunctional parts therein. The femtosecond laser processing is performed usually by adopting a single beam of light to scan and process the micro-channels or microfunctional parts, and the use of multiple beams of light for parallel processing of microfunctional parts has also been reported, which has achieved a certain improvement in the processing efficiency However, compared to the high-efficiency and intelligent preparation of integrated circuit chips in computers and mobile phones, the current preparation technology of microfluidic chips has poor efficiency and low intelligence, which still needs to be improved. Therefore, it is necessary to propose a more efficient, controllable and intelligent microfluidic chip preparation technology.

In the present disclosure, the femtosecond laser is controlled to output the large-format array femtosecond laser with adjustable key parameters, which is further used to form large-format interference. The interference state, interference combination and exposure mode of each femtosecond laser beam are controlled to realize the large-format direct printing processing of microfluidic chips, manufacturing complex three-dimensional structures inside the microfluidic chips. The present disclosure significantly improves the processing efficiency, stability, flexibility and intelligence of the microfluidic chip, thereby facilitating the further development and innovation of the microfluidic chip manufacturing technology. As a consequence, the disclosure is of great significance to the processing of microfluidic chips.

SUMMARY

An object of the application is to provide a device and a method for direct printing of a microfluidic chip based on a large-format array femtosecond laser, to overcome the problems of poor processing efficiency, low processing speed, and low degree of controllable intelligence in the point scanning of the existing femtosecond laser preparation of microfluidic chips. In the disclosure, an adjustable large-format femtosecond laser array is regulated in the interference state, interference combination and exposure mode to realize the large-format direct printing of the microfluidic chip, thereby manufacturing microfluidic chips with complex three-dimensional structures. As a consequence, this disclosure improves the stability, flexibility, degree of intelligence, and efficiency of processing of microfluidic chips, facilitating the batch manufacture of microfluidic chips.

The technical solutions of the present disclosure are described as follows.

In a first aspect, the present disclosure provides a method for direct printing of a microfluidic chip based on a large-format array femtosecond laser, comprising:

(1) pre-amplifying a seed light followed by splitting through a pulse splitting device to form an m×n array laser; performing pre-amplification and pre-compression multiple times on each laser beam of the array laser; regulating a phase, a light intensity, a polarization, a center wavelength, and a pulse width of each laser beam of the array laser, respectively, to output the large-format array femtosecond laser;

(2) allowing the large-format array femtosecond laser to pass through a reflecting mirror array element device; regulating combination of laser beams to form a plurality of beam interference groups varying in the number of laser beams for large-format femtosecond laser interference; regulating a combination and an exposure method of each of the plurality of beam interference groups followed by superposition of multiple exposures to output a desired pattern, thereby enabling femtosecond laser interference direct printing processing of the microfluidic chip;

(3) allowing the large-format array femtosecond laser to pass through the reflecting mirror array element device; regulating laser beams in a specific area to perform a selected-area interference at a specific position, to realize a femtosecond laser-based selected-area interference direct printing processing on the microfluidic chip, and an ablation processing in a selected area with a specific location and a specific feature;

(4) subjecting the microfluidic chip to layering to divide the microfluidic chip into three types of feature areas comprising a complex variable section micro-channel area, a simple fixed section micro-channel area, and a non-processing feature area; and according to a feature of layered areas of the microfluidic chip from bottom to top, intelligently regulating processing methods to realize processing of the microfluidic chip; and (5) subjecting the microfluidic chip after direct printing to ultrasonic-assisted etching in a hydrofluoric acid solution, to dredge micro-channels inside the microfluidic chip, thereby forming complex three-dimensional micro-channels on the microfluidic chip.

The output technology of the large-format array femtosecond laser can be regulated through delay, light intensity, polarization, frequency doubling and pulse compression, to output m×n array femtosecond laser in which the phase φ, the light intensity I, the polarization p, the center wavelength λ, and the pulse width t are adjustable, which is used as a light source for direct printing of the microfluidic chips.

The m×n array femtosecond laser is expressed as follows:

$$f = \begin{bmatrix} f_{11} & f_{12} & \cdots & f_{1n} \\ f_{21} & f_{22} & \cdots & f_{2n} \\ \vdots & \vdots & \ddots & \vdots \\ f_{m1} & f_{m2} & \cdots & f_{mn} \end{bmatrix}.$$

The phase of the m×n array femtosecond laser is expressed as follows:

$$\varphi = \begin{bmatrix} \varphi_{11} & \varphi_{12} & \cdots & \varphi_{1n} \\ \varphi_{21} & \varphi_{22} & \cdots & \varphi_{2n} \\ \vdots & \vdots & \ddots & \vdots \\ \varphi_{m1} & \varphi_{m2} & \cdots & \varphi_{mn} \end{bmatrix}.$$

The light intensity of the m×n array femtosecond laser is expressed as follows:

$$I = \begin{bmatrix} I_{11} & I_{12} & \cdots & I_{1n} \\ I_{21} & I_{22} & \cdots & I_{2n} \\ \vdots & \vdots & \ddots & \vdots \\ I_{m1} & I_{m2} & \cdots & I_{mn} \end{bmatrix}.$$

The polarization of the m×n array femtosecond laser is expressed as follows:

$$\lambda = \begin{bmatrix} \lambda_{11} & \lambda_{12} & \cdots & \lambda_{1n} \\ \lambda_{21} & \lambda_{22} & \cdots & \lambda_{2n} \\ \vdots & \vdots & \ddots & \vdots \\ \lambda_{m1} & \lambda_{m2} & \cdots & \lambda_{mn} \end{bmatrix}.$$

The pulse width of the m×n array femtosecond laser is expressed as follows:

$$\lambda = \begin{bmatrix} \lambda_{11} & \lambda_{12} & \cdots & \lambda_{1n} \\ \lambda_{21} & \lambda_{22} & \cdots & \lambda_{2n} \\ \vdots & \vdots & \ddots & \vdots \\ \lambda_{m1} & \lambda_{m2} & \cdots & \lambda_{mn} \end{bmatrix}.$$

Any femtosecond laser sub-beam $f_{ij}$ in the m×n array femtosecond laser can be expressed as follows:

$f_{ij}=g(\varphi_{ij},I_{ij},p_{ij},\lambda_{ij},\tau_{ij})$.

In some embodiments, a pulse width of each beam laser of the large-format array femtosecond laser modulated in step (1) is less than or equal to 200 fs, and a single pulse energy of each beam laser of the large-format array femtosecond laser is more than or equal to 10 μJ.

In some embodiments, a center wavelength of the large-format array femtosecond laser is 200-400 nm (ultraviolet light), 400-700 nm (visible light) or 700-2500 nm (infrared ray).

Specifically, a center wavelength of the femtosecond laser is set as follows: the ultraviolet light could be 260 nm, 343 nm and 355 nm; the visible light could be 400 nm, 515 nm and 532 nm; and the infrared light could be 800 nm, 1030 nm, 1064 nm and 1550 nm.

In some embodiments, the interference direct printing processing in step (2) is performed by laser beam combined interference processing; the plurality of beam interference groups are formed in a processing area; and each of the plurality of beam interference groups adopts two or more femtosecond laser beams to perform interference or regulate exposure mode.

In some embodiments, in step (2), a regulation of a femtosecond laser state of each of the plurality of beam interference group is enabled; a plurality of laser beams with different wavelengths are regulated to generate a linear interference effect and a nonlinear interference effect, thereby regulating interference cycle, interference spot size and interference pattern; and the regulation of the femtosecond laser state comprises regulations of the phase φ, the light intensity I, the polarization p, the center wavelength λ and the pulse width t of each beam laser in the large-format array femtosecond laser.

In some embodiments, in step (2), the combination and the exposure mode of each of the plurality of the laser beam interference groups are regulated, and a state of each femtosecond laser beam in each of the plurality of laser beam interference groups is regulated, so that the desired pattern for processing of the microfluidic chip is output by controlling the superposition of multiple exposure, thereby realizing the interference direct printing processing of the microfluidic chip.

In some embodiments, a size of interference spot and a size of an interference array point of laser beams are regulated by the plurality of laser beam interference groups; a laser energy is controlled to make an energy at a peak of the interference array point reaches an ablation threshold of a material of the microfluidic chip; and a resolution of the peak of the interference array point is 0.1 μm.

In some embodiments, in step (3), the laser beams in the specific area is regulated to produce interference to enable selected-area interference direct printing or selected-area interference ablation.

In some embodiments, in step (3), two or more femtosecond laser beams are adopted to perform interference to realize a regulation of an interference state of each femtosecond laser beam and a regulation of a size of an interference spot.

In some embodiments, in the selected-area interference direct printing processing, laser beams in the specific area are regulated to generate interference, and interference spots formed by the selected area interference form and output the desired pattern, to realize the interference direct printing processing of the microfluidic chip.

In some embodiments, the selected-area interference ablation enables selected-area processing of one or more longitudinal micro-channels on the microfluidic chip.

In some embodiments, the layered control processing technology is generally based on the bottom-up processing principle, and in step (4), an interference layered processing and an interference continuous scanning processing are performed according to features of each processing area.

In some embodiments, in step (4), the complex variable section micro-channel area has a complex three-dimensional structure and sections have different features; the complex variable section micro-channel area is processed by interference layered direct printing processing; in the interference layered direct printing processing, a layered slice of an area needs to be determined according to a depth of focus of laser interference; a thickness of the layered slice is consistent with an ablation depth of laser interference ablation, wherein the thickness of the layered slice is 0-50 μm.

The interference layered direct printing processing in the complex variable section micro-channel area is performed from bottom to up; an exposure time of processing of a single-layered slice is controlled according to processing requirements of the microfluidic chip, to manufacture a three-dimensional micro-channel structure with continuous intercommunication between layers; the interference layered direct printing processing process is performed based on large-format array interference direct printing technology and large-format array selected-area interference processing technology.

In some embodiments, in step (4), the simple fixed section micro-channel area has a simple three-dimensional structure with section having the same feature, and is processed by interference continuous scanning processing; in the interference continuous scanning processing, the array femtosecond laser is controlled to generate laser interference to perform ablation processing at a specific position.

The interference continuous scanning processing for the simple fixed section micro-channel area is performed from bottom to up; a scanning speed is controlled according to processing requirements of the microfluidic chip, to manufacture three-dimensional micro-channel structure by continuous ablation.

The interference continuous scanning processing is performed based on a large-format array selected-area interference processing technology.

In some embodiments, in step (5), the ultrasonic-assisted etching in the hydrofluoric acid solution is performed to post-process the microfluidic chip after direct printing, to dredge the micro-channels of the microfluidic chip.

In a second aspect, the present disclosure provides a device for direct printing of a microfluidic chip based on a large-format array femtosecond laser, comprising:
an array laser for outputting the large-format array femtosecond laser;
an interference regulation system for regulating laser interference direct printing;
a processing platform for processing the microfluidic chip;
an imaging unit for monitoring a processing status in real time;
a control cabinet for implementing an integrated control of the device; and
a program software for model processing and signal encoding;
wherein the large-format array femtosecond laser has controllable phase φ, light intensity I, polarization p, center wavelength λ and pulse width τ; the interference regulation system performs an interference regulation on the large-format array femtosecond laser by regulating a laser interference state, an interference combination and an exposure mode, so that a plurality of exposures are superposed to output a desired direct printing pattern for a direct printing processing of the microfluidic chip in the processing platform; the program software is configured to preprocess a three-dimensional model of an imported microfluidic chip to be processed, and convert processing information obtained by processing and analysis into electrical signals and input the electrical signals into the control cabinet; the control cabinet is configured to control the direct printing process of the microfluidic chip through control signals; and the imaging unit is configured to monitor and record a real-time state of the direct printing processing of the microfluidic chip.

In some embodiments, the array laser is configured to output an m×n large-format array femtosecond laser beam, and regulate a phase, a light intensity I, a polarization p, a center wavelength 2, and a pulse width t of each laser beam of the m×n large-format array femtosecond laser beam to output femtosecond lasers in different states; the array laser comprises a seed light source, a pre-amplifier, a beam splitting device, a multi-stage pre-amplifier, a multi-stage pre-compressor, and a laser state control part.

The seed light source is an energy source for processing; the pre-amplifier is configured to pre-amplify a seed light emitted from the seed light source;

The beam splitting device is configured to split the pre-amplified seed light into an m×n array laser.

The multi-stage pre-amplifier and the multiple-stage pre-compressor are configured to perform a multi-stage pre-amplification and a multi-stage pre-compression on each laser beam of the m×n array laser, respectively.

The laser state control part is configured to regulate the phase φ, light intensity I, the polarization p, the center wavelength λ, and the pulse width τ, and output the large-format array femtosecond laser which states of laser beams are different and adjustable.

In some embodiments, the interference regulation system is configured to regulate an interference state of the large-format array femtosecond laser, regulate an interference of any number of laser beams at any position, and regulate a combination and an exposure mode of laser beams; the interference regulation system comprises a beam collimating device and a reflecting mirror array element device.

The beam collimating device is configured to collimate laser beams of the large-format array femtosecond laser output by the array laser, and regulate a spot size of an output collimated laser.

The reflecting mirror array element device is an array combination of m×n reflecting mirrors of which a reflecting direction is controllable in XY; and each reflecting mirror array element is configured to control a position of a corresponding laser spot on the microfluidic chip, so as to control a corresponding laser beam to perform interference.

In some embodiments, the processing platform is configured to realize positioning of a processing zero point of the microfluidic chip and a control of a Z-direction processing depth; the processing system comprises a working platform and a three-dimensional micro-nano platform.

The working platform is configured to fix the microfluidic chip to be processed.

The three-dimensional micro-nano platform is configured to regulate a XYZ position of the sample according to the control signal.

In some embodiments, the imaging unit is configured to image and monitor a surface of the microfluidic chip processed by direct printing in real time; the imaging unit comprises a high-speed camera imaging system and an auto-focusing system.

The high-speed camera imaging system is configured to realize real-time monitoring and high-speed photographing of the surface of the microfluidic chip processed by direct printing; and the auto-focusing system is configured to an auto focusing of the high-speed camera imaging system.

In some embodiments, the control cabinet is an integrated control system, which is configured to integrate the regulations of the phase φ, the light intensity I, the polarization p, the center wavelength λ and the pulse width t of each laser beam in the large-format array femtosecond laser output by in the array laser, regulate the reflecting mirror array element device in the interference regulation system, and regulate the three-dimensional micro-nano platform of the processing system.

In some embodiments, the program software is configured to provide an integrated user-friendly analysis, control and monitor software; the program software comprises a model preprocessing module, a signal encoding module, a real-time display module, an image processing system and a simulation display module.

The model preprocessing module is configured to perform a layered processing of feature regions according to a features of the microfluidic chip to be processed, and perform a layered slicing processing on a complex variable section micro-channel regions in the microfluidic chip to be processed; the signal encoding module is configured to perform a signal encoding on a processing feature of a preprocessed mocrofluidic chip model, and obtain a processing signal, and import the processing signal into the integrated control system.

The real-time display module is configured to realize a real-time display of processing status of the microfluidic chip monitored by the high-speed camera imaging system; the image processing system is configured to process and analyze the image signals acquired by the real-time display module, to realize online analysis and monitoring of processing quality of the microfluidic chip.

The simulation display module is configured to realize a simulation display of processing of the microfluidic chip according to an execution status of a processing program to monitor processing status and processing progress.

Compared to the prior art, the present invention has the following beneficial effects.

Compared to the commonly used femtosecond laser ablation processing, the present disclosure transforms a traditional spot ablation scanning processing into a large-format direct printing scanning processing based on the principle of large-format femtosecond laser interference. Complex large-format structures can be manufactured in the cross section by ablation after one or multiple exposures, and the micro-channels, the inlet ports, the outlet ports, and some functional parts of the microfluidic chip can be processed at one time by controlling the direct printing scanning processing to move in the depth direction. The large format direct printing scanning processing has a wide range of scales, a fast processing speed and a high processing efficiency, thus, it is suitable for the processing of microfluidic chips with complex shapes.

Compared to soft lithography technology, the present disclosure utilizes the features of femtosecond laser non-linear processing and has no use for any mask, to realize a large-format direct printing processing at different depths of the microfluidic chip, thereby directly printing complex three-dimensional structure inside the microfluidic chip.

In addition, the present disclosure can realize an intelligent control processing of the microfluidic chip. According to the processing features of the microfluidic chip, the interference layered processing and the interference continuous scanning processing method can be used to intelligently perform the intelligent control on different areas of the microfluidic chip, thereby significantly shortening the processing cycle and improving processing efficiency.

In general, in the direct printing device based on a large-format array femtosecond laser microfluidic chip and the method using the same provided in the present disclosure, the large-format array femtosecond laser intelligent control is used to realize high-efficiency direct printing processing of microfluidic chips. The large-format femtosecond laser array can satisfy the direct printing processing of a single microfluidic chip, and can also complete the parallel direct printing of multiple small-size microfluidic chips, which has significant advantages in the preparation and processing of microfluidic chips with complex three-dimensional micro-channels. The present disclosure can realize a rapid processing of the microfluidic chip, and significantly improves the preparation efficiency of the microfluidic chip. The processing process has the features of high stability, high flexibility, and high intelligence, and is suitable for the preparation of microfluidic chips of various materials such as glass and polymers.

Figure 1:
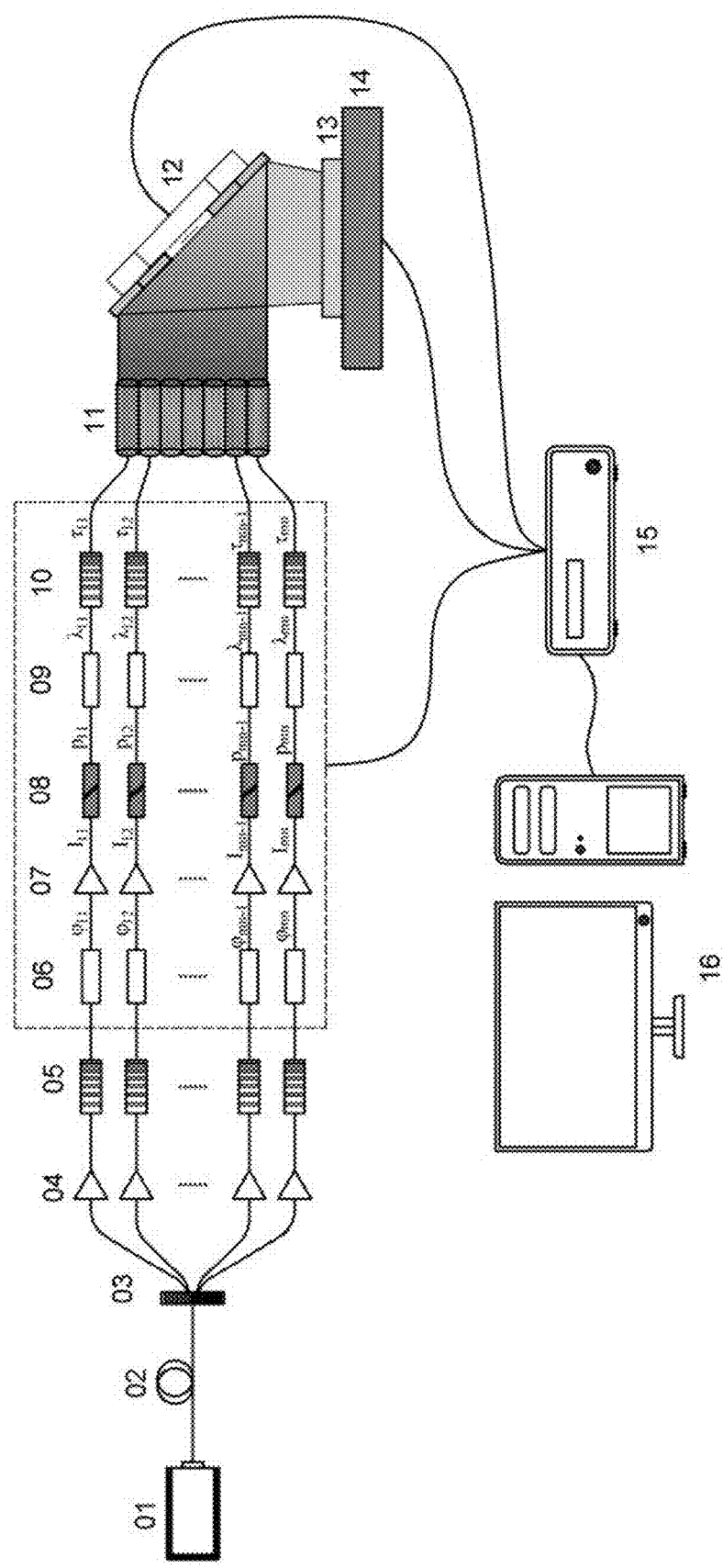
FIG. 1 is a schematic diagram of an optical path of a direct printing processing based on a large-format array femtosecond laser microfluidic chip according to an embodiment of the present disclosure.

In the drawings: 01, seed light source; 02, gain fiber; 03, pulse beam splitter; 04, multi-stage amplifier; 05, pulse compressor; 06, phase modulator; 07, light intensity modulator; 08, polarization controller; 09, frequency multiplication device; 10, pulses compressor; 11, collimator; 12, reflecting mirror array element device; 13, microfluidic chip to be processed; 14, three-dimensional micro-nano platform; 15, integrated controller; and 16, computer system.

DETAILED DESCRIPTION OF EMBODIMENTS

The present disclosure will be illustrated with reference to the following embodiments and the accompanying drawings. In these embodiments, the direct printing microfluidic chip preparation technology based on the large-format array femtosecond laser is realized based on femtosecond laser interference, and these embodiments are not intended to limit the present disclosure, where all the similar methods and similar changes adopted in the present disclosure should be included in the protection scope of the present disclosure.

The computer system (16) in FIG. 1 realizes the regulations of the phase modulator (06), the light intensity modulator (07), the polarization controller (08), the frequency multiplier (09), and the pulse compressor (10) through the integrated controller (15), and controls the phase φ, the light intensity I, the polarization p, the center wavelength λ, and the pulse width τ of each laser beam, thereby realizing a signal control of each reflecting mirror unit in the reflecting mirror array element device (12), and a XYZ displacement control of the three-dimensional micro-nano platform (14).

After the seed light output by the seed light source (01) is pre-amplified by the gain fiber (02), the laser beam is split into m×n laser beams by the pulse beam splitter (03). Each split laser beam is performed pre-amplification and pre-compression through the multi-stage amplifier (04) and the pulse compressor (05), and the phase φ, the light intensity I, the polarization p, the center wavelength λ and the pulse width τ of each laser beam is regulated through the phase modulator (06), the optical enhancement damper (07), the polarization controller (08), the frequency multiplier (09), and the pulse compressor (10), thereby outputting an m×n array femtosecond laser with a pulse width equal to or less than 200 fs.

The output m×n array femtosecond laser passes through the reflecting mirror array element device (12) to precisely regulate the position of each beam splitting laser and regulate the interference state of the laser, so as to realize an interference control of the large-format array femtosecond laser, where the output direct printing pattern is directly used for the ablation processing of the microfluidic chip to be processed (13).

Figure 2A:
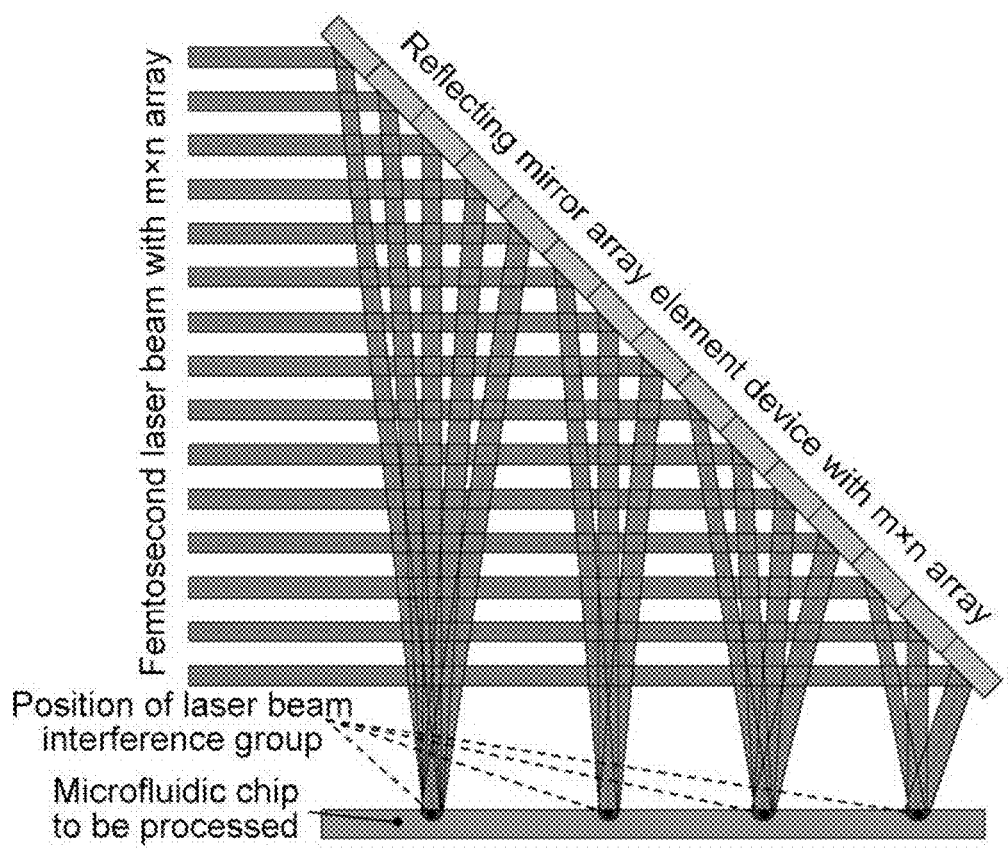
FIG. 2a shows a direct printing processing based on the large-format array femtosecond laser interference according to an embodiment of the present disclosure.
Figure 2B:
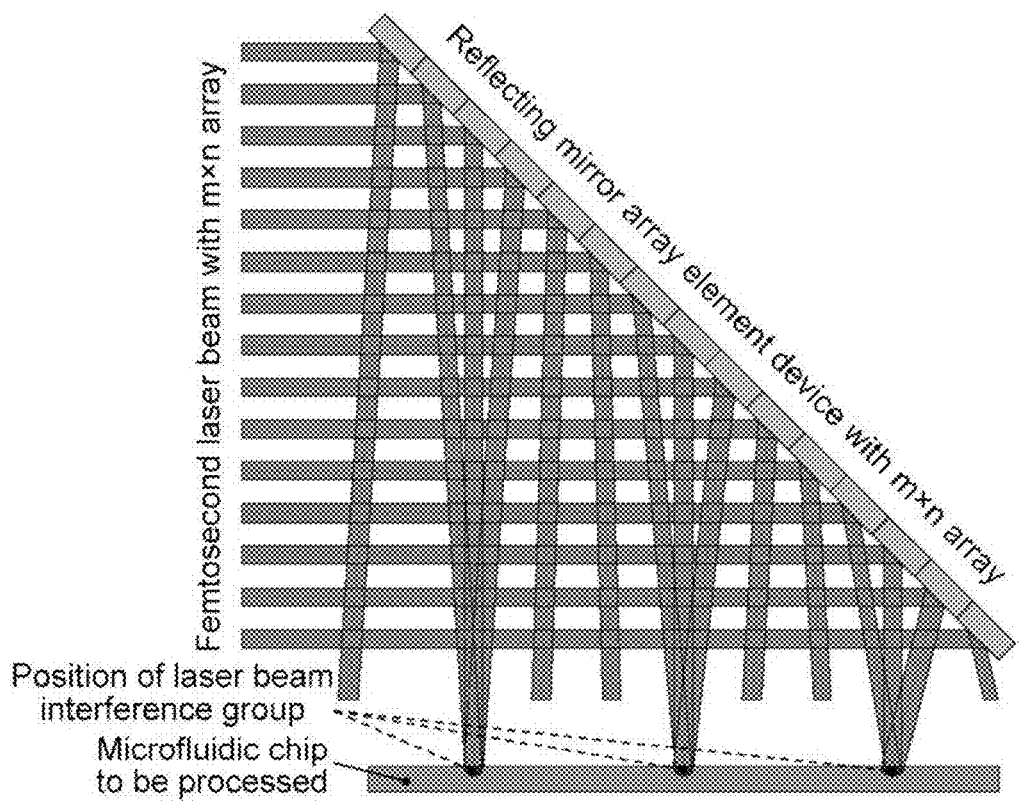
FIG. 2b shows a direct printing/ablation processing based on the large-format array femtosecond laser interference according to an embodiment of the present disclosure.

FIGS. 2a-2b shows the adjustment of the array femtosecond laser interference through the m×n reflecting mirror array device. In FIG. 2a, the large-format array femtosecond laser interference is adopted to realize the large-format array combined interference direct printing processing; in FIG. 2b, the large-format array femtosecond laser selected-area interference is adopted to realize large-format array selected-area interference direct printing/ablation processing. The m×n reflecting mirror array device can control the position of the corresponding laser beam in the X and Y directions, so as to realize the precise control of each laser beam on the microfluidic chip.

When performing interference layered processing on the complex variable sectional micro-channel area in the microfluidic chip, the position of the spot of each beam interference group is regulated by regulating the m×n reflecting mirror array device, so that each beam in the interference group is achieved at its geometric center position, and the number of laser beams in each interference group can be regulated to different numbers, which can be two or more beams. When performing interference continuous scanning processing on the simple fixed section micro-channel area in the microfluidic chip, the m×n reflecting mirror array device is selectively regulated to make the corresponding array laser beam form the same interference pattern as the feature in the processing feature area. The interference laser beam can be two or more beams. The processing is implemented by controlling the Z-direction continuous scanning of the three-dimensional micro-nano platform.

Figure 3:
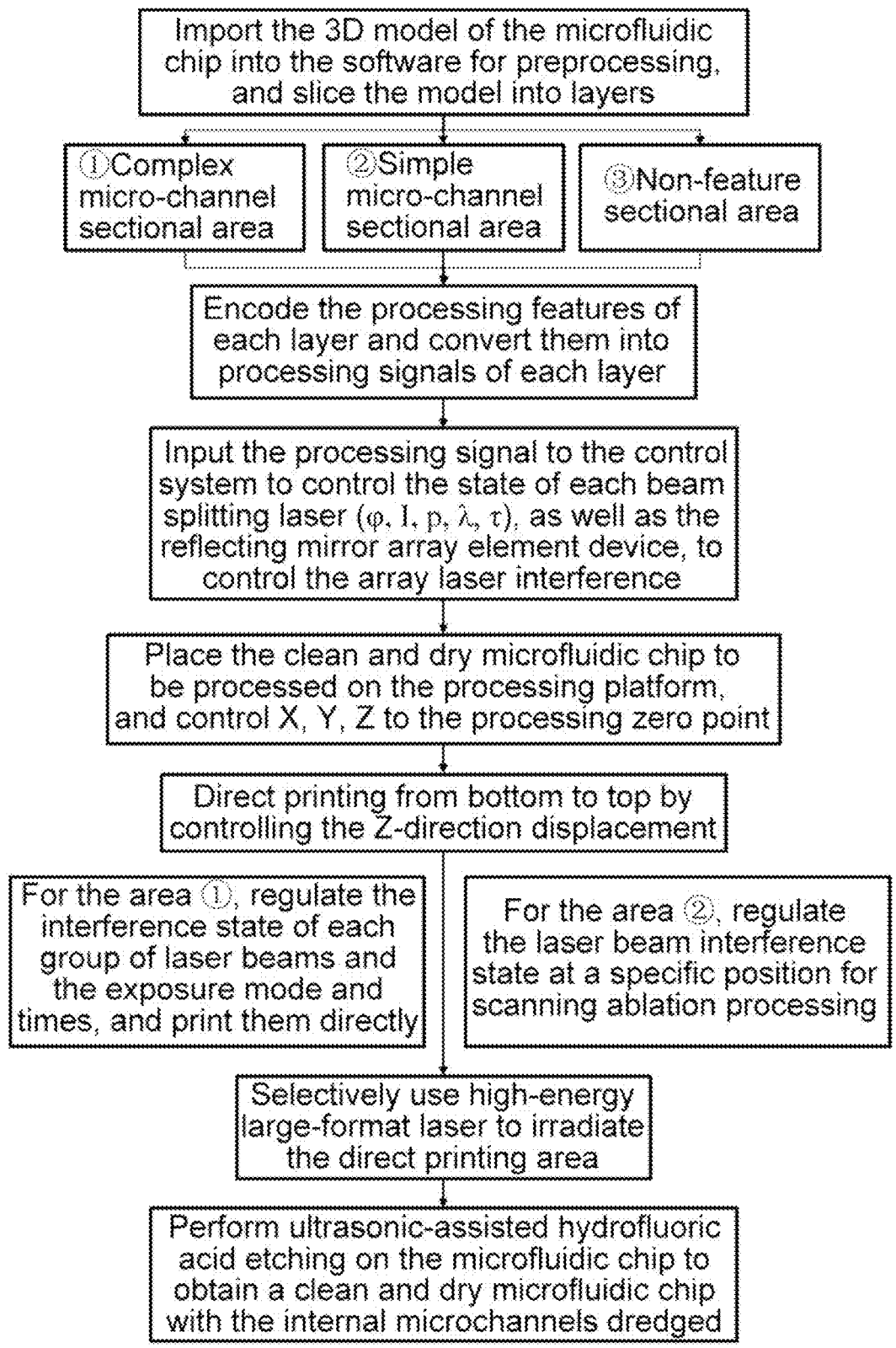
FIG. 3 is a flow chart of a direct printing processing of the microfluidic chip according to an embodiment of the present disclosure.

FIG. 3 is a flowchart of the direct printing processing of the microfluidic chip according to an embodiment of the present disclosure.

First of all, the three-dimensional model of the microfluidic chip to be processed is established through a computer drawing software, and then imported into the direct printing device system software for preprocessing. According to the processing features, the microfluidic chip can be divided into three types of feature areas: (1) complex variable section micro-channel area, which is a complex three-dimensional structure area with variable sections composed of horizontal and vertical micro-channels of a microfluidic chip; (2) simple fixed-section micro-channel area, which is composed of the longitudinal micro-channels of the microfluidic chip, a simple three-dimensional structure area with a fixed section; and (3) non-processing feature area, where there is no micro-channel that needs to be processed. For the complex variable section micro-channel area, according to the set layer thickness of 0-50 μm, the type of feature area is subjected to layered slicing processing.

Then, the processing features and the position data of each layer of each feature area and the complex variable section micro-channel area are encoded and converted into corresponding processing signals. The processing feature signal of each feature area and each layer corresponds to the mirror of the m×n reflecting mirror array element device one-to-one, and the Z-direction signal is imported into the three-dimensional micro-nano platform to realize a Z-direction position control.

Subsequently, the encoded processing signal is inputted into the control system thought the software, and the phase φ, the light intensity I, the polarization p, the wavelength λ, and the pulse width τ of each split femtosecond laser are controlled, as well as the reflecting mirror array element device is controlled, thereby realizing the interference control of the array femtosecond laser. The processing signals of each layer include the Z-direction position signal of the three-dimensional micro-nano platform, the state of each femtosecond laser in each exposure, and the state signal of each corresponding reflecting mirror in the reflecting mirror array element device.

Subsequently, the cleaned and dried microfluidic chip to be processed is placed and fixed on the processing sample table, and the X, Y, and Z direction positions of the three-dimensional micro-nano platform are controlled so that the microfluidic chip to be processed is placed at the processing zero position.

Subsequently, the laser is turned on and the exposure times of the single-layer interference direct printing is controlled. The Z-direction displacement of the three-dimensional micro-nano platform is controlled, and the three-dimensional microfluidic chip microstructure is processed from bottom to top from the bottom layer. For the complex variable section micro-channel area, by regulating the laser state, combination and exposure mode of each laser beam interference group, multiple exposures are superimposed to control the corresponding array pattern, and interference layered processing is performed. For the fixed section micro-channel area, interference continuous scanning processing is performed by selectively regulating the interference state of the laser beam at a specific position.

Subsequently, while performing laser interference direct printing and laser interference ablation processing on the microfluidic chip, a high-energy large-format laser can be selectively used to irradiate the microfluidic chip area to enhance the impact effect on the ablation area of the processing feature.

Finally, the microfluidic chip that has been directly printed is subjected to post-processing such as hydrofluoric acid ultrasonic etching to dredge the micro-channel of the microfluidic chip, thereby obtaining a clean and dry microfluidic chip. The microfluidic chip of fused silica material uses hydrofluoric acid with a concentration of 10-30% for ultrasonic etching for 15-45 min to realize the dredging of the processed internal three-dimensional micro-channels. After cleaning and drying, the microfluidic chip with the micro-channel is completely dredged and the cavity cleaned is obtained.

Figure 4:
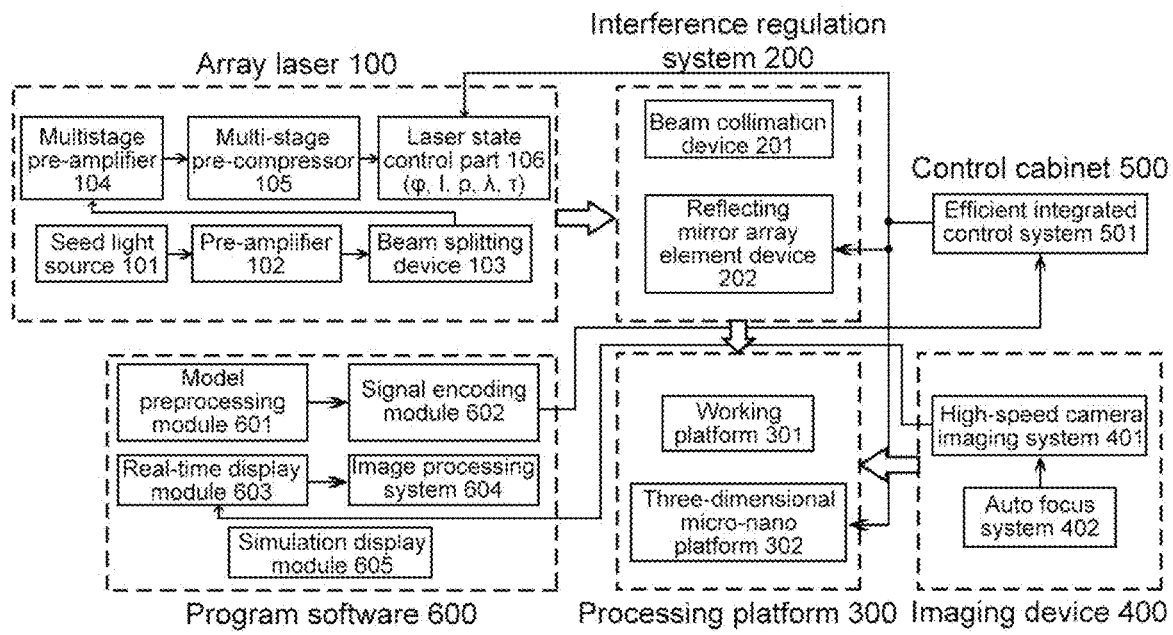
FIG. 4 is a schematic diagram of the component units of a direct printing device of the microfluidic chip according to an embodiment of the present disclosure.
Figure 5A:
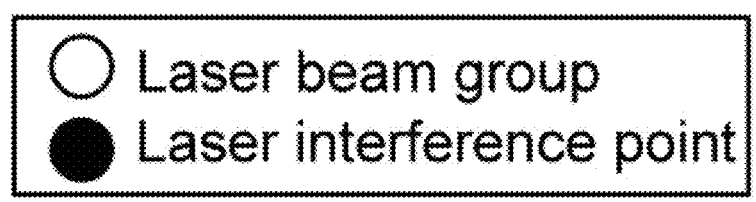
FIGS. 5a-5h are schematic diagrams of a combination mode of a laser beam interference group according to an embodiment of the present disclosure.
Figure 5A:
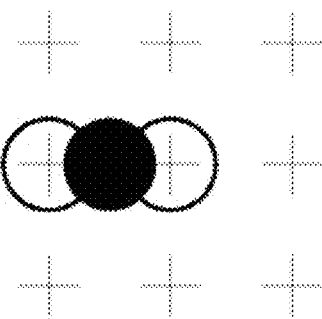
Figure 5B:
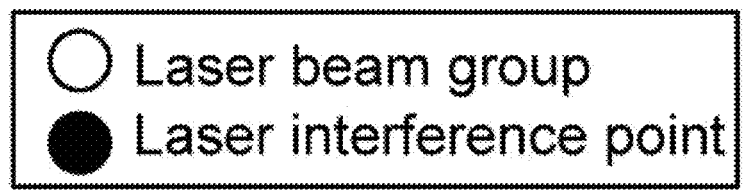
Figure 5B:
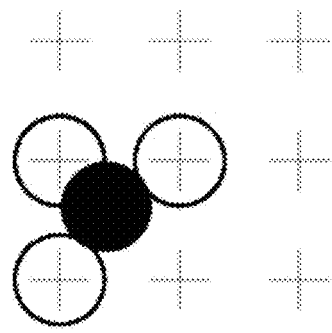
Figure 5C:
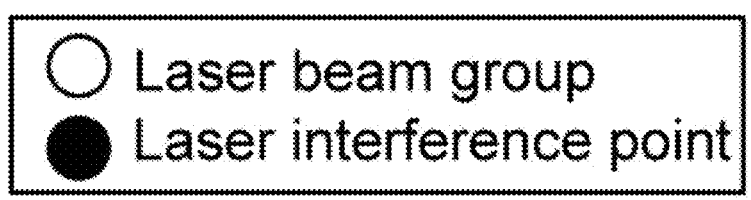
Figure 5C:
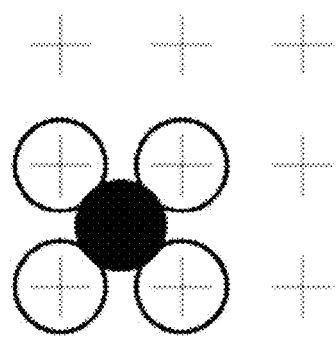
Figure 5D:
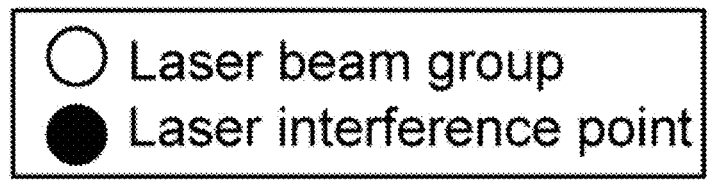
Figure 5D:
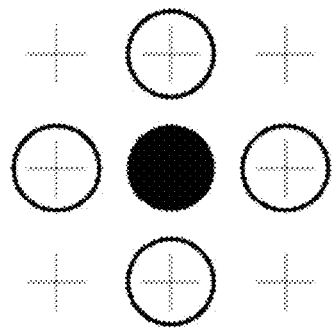
Figure 5E:
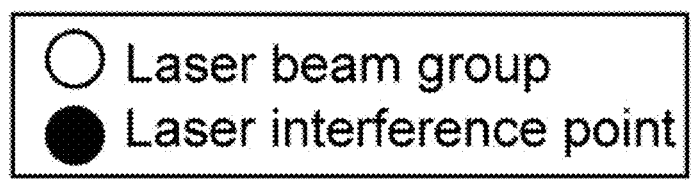
Figure 5E:
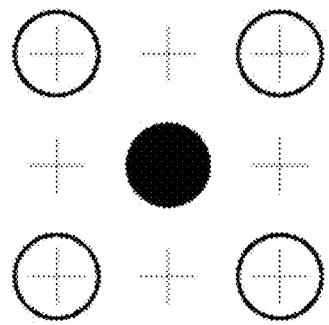
Figure 5F:
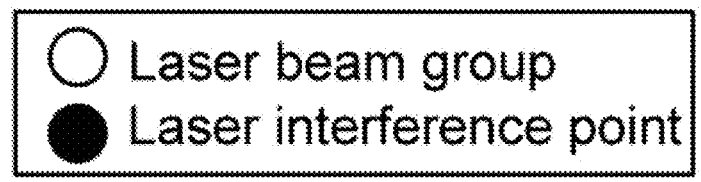
Figure 5F:
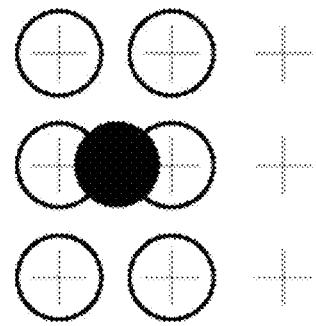
Figure 5G:
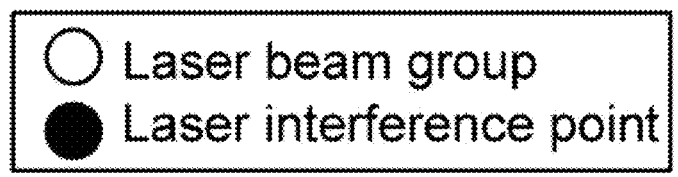
Figure 5G:
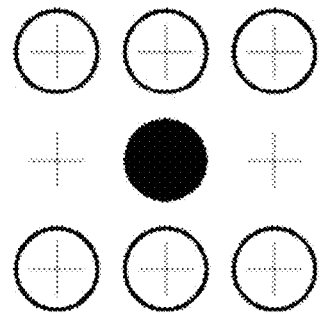
Figure 5H:
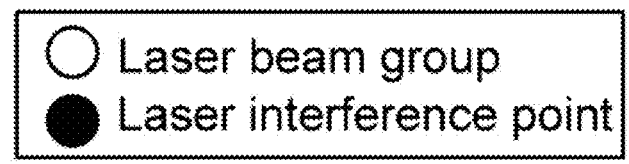
Figure 5H:
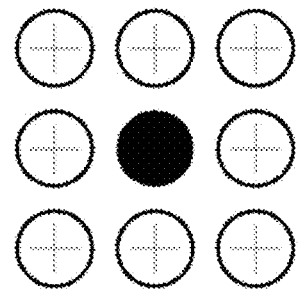
Figure 6A:
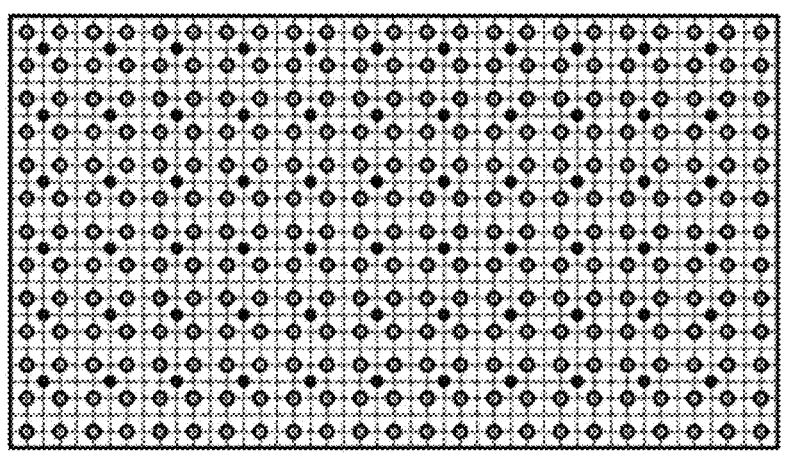
FIGS. 6a-6d are schematic diagrams of the laser beam interference group of four laser beams and different exposure methods thereof according to an embodiment of the present disclosure.
Figure 6B:
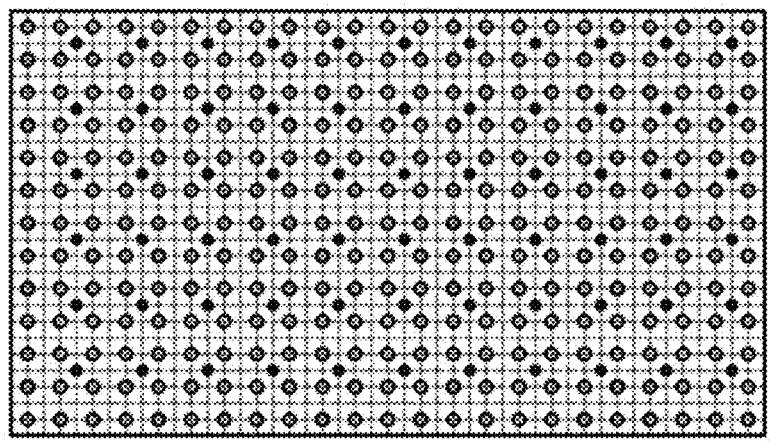
Figure 6C:
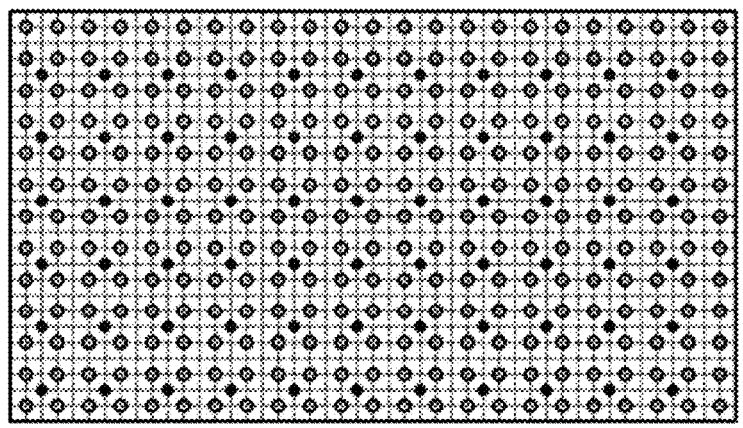
Figure 6D:
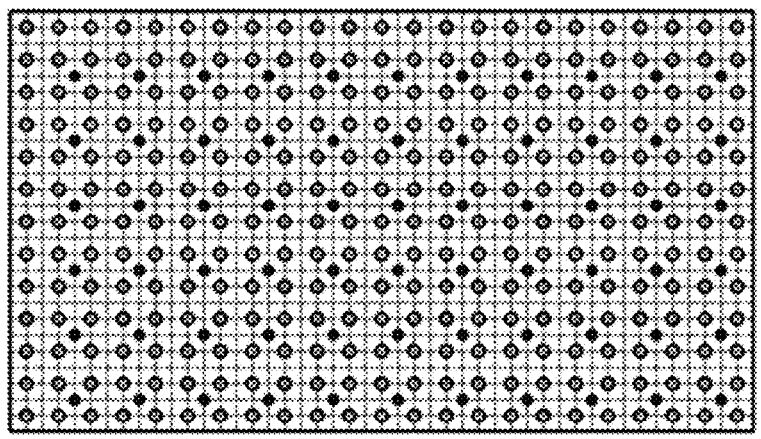

FIG. 4 is a schematic diagram of the component units of a direct printing device based on the large-format array femtosecond laser microfluidic chip. The component units include an array laser 100, an interference regulation system 200, a processing platform 300, an imaging unit 400, a control cabinet 500, and a program software 600.

The array laser 100 equipped with the present disclosure includes a seed light source 101, a pre-amplifier 102, a beam splitting device 103, a multi-stage pre-amplifier 104, a multi-stage pre-compressor 105 and a laser state control part 106. After pre-amplified by the pre-amplifier 102, the laser beam emitted by the seed light source 101 is split into m×n laser beams by the beam splitting device 103, and each laser beam passes through the multi-stage pre-amplifier 104 and the multi-stage pre-compressor 105 for multi-stage pre-amplification and multi-stage pre-compression. The laser state control part 106 controls the phase φ, the light intensity I, the polarization p, the wavelength λ and the pulse width τ of each laser beam, thereby finally outputting an array femtosecond laser with different features and adjustable parameters.

The interference regulation system 200 equipped in the present disclosure includes a beam collimating device 201 and a reflecting mirror array element device 202. The beam collimation device 201 collimates the array femtosecond laser output from the array laser 100, and adjusts the spot size. The reflecting mirrors in the reflecting array element device 202 can precisely control the position of each beam laser, which can not only realize the interference control of large-format array lasers, but also can perform large-format array combined interference direct printing processing and large-format array selected-area interference direct printing/ablation processing on the microfluidic chips.

The processing platform 300 equipped in the present disclosure includes a working platform 301 and a three-dimensional micro-nano platform 302. The working platform 301 is used to place the microfluidic chip to be processed and is arranged on the three-dimensional micro-nano platform 302. By controlling the three-dimensional micro-nano platform 302, the precise positioning of the microfluidic chip in the XY direction can be achieved, so that the microfluidic chip can be placed at the processing zero position. At the same time, the position of the microfluidic chip in the Z direction can also be accurately controlled to make it work from bottom to top in the Z direction.

The imaging unit 400 equipped in the present disclosure includes a high-speed camera imaging system 401 and an auto focus system 402. The high-speed camera imaging system 401 can realize a real-time monitoring and a high-speed photography of the direct printing surface of the microfluidic chip. The auto-focusing system 402 realizes the auto-focusing of the high-speed camera imaging system 401.

The control cabinet 500 equipped in the present disclosure is an efficient integrated control system 501, in which the data analyzed and processed by the program software is converted into a control signal. The control signal is then imported into the efficiency integrated control system 501, thereby realizing a high-precision graphical control of array points of the femtosecond laser. The main achievable control functions include: 1) realize the control of the phase φ, the light intensity I, the polarization p, the wavelength λ, and the pulse width τ of each beam of the output large-format array femtosecond laser; 2) realize the control of the angle of each reflecting mirror in the reflecting mirror array element device; and 3) realize the high-precision control of the three-dimensional micro-nano platform.

The program software 600 equipped in the present disclosure includes a model preprocessing module 601, a signal encoding module 602, a real-time display module 603, an image processing system 604, and a simulation display module 605. The model preprocessing module 601 performs layered processing of the feature regions of the imported three-dimensional model of the microfluidic chip according to the processing features, and performs layered slicing processing on the complex variable section micro-channel region, so that the processing features in each layer in each feature area of the model are simulated to generate corresponding interference patterns by graphic features. The model preprocessing module 601 calculates the corresponding laser state parameters, laser beam interference group combination and exposure mode. The signal encoding module 602 is used to convert the corresponding laser beam parameters and position data into the digital signal to import into the control system, thereby realizing the control of the interference direct printing processing. The real-time display module 603 and the image processing system 604 monitor and analyze the processing of the microfluidic chip in real time, grasp the state of the processing of the microfluidic chip, and timely judge, analyze and deal with the problems existing in the processing. The simulation display module 605 assists in displaying the progress and status of the processing of the microfluidic chip according to the execution program.

FIG. 5 is a schematic diagram of the combination mode of the laser beam interference group of the present disclosure. Different interference combinations can be realized by regulating the array femtosecond laser beams. The eight pictures in FIG. 5 respectively show schematic diagrams of interference groups such as two beams, three beams, four beams, five beams, and six beams. By regulating the phase φ, the light intensity I, the polarization p, the wavelength λ, the pulse width τ of each beam laser, and the laser beam group interference mode, the output of the interference pattern of the microfluidic chip to be processed is realized. FIG. 6 is a schematic diagram of a laser beam group composed of four lasers, in which four adjacent laser beams can be used to interfere at the geometric center position to control the four exposure modes shown in the four pictures in FIG. 6, and four exposures can be superimposed to achieve interference direct printing of the microfluidic chip.

Figure 7A:
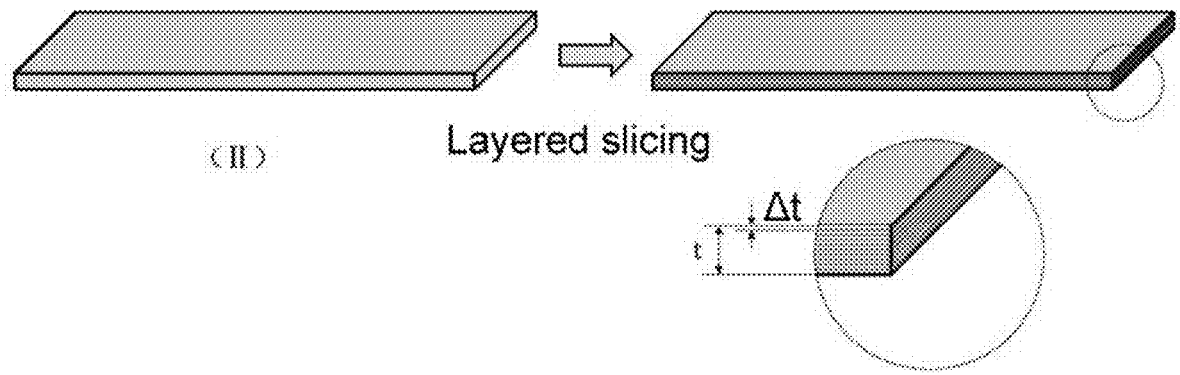
FIG. 7a shows a first schematic diagram of a layered processing of feature regions of the microfluidic chip model according to an embodiment of the present disclosure.
Figure 7B:
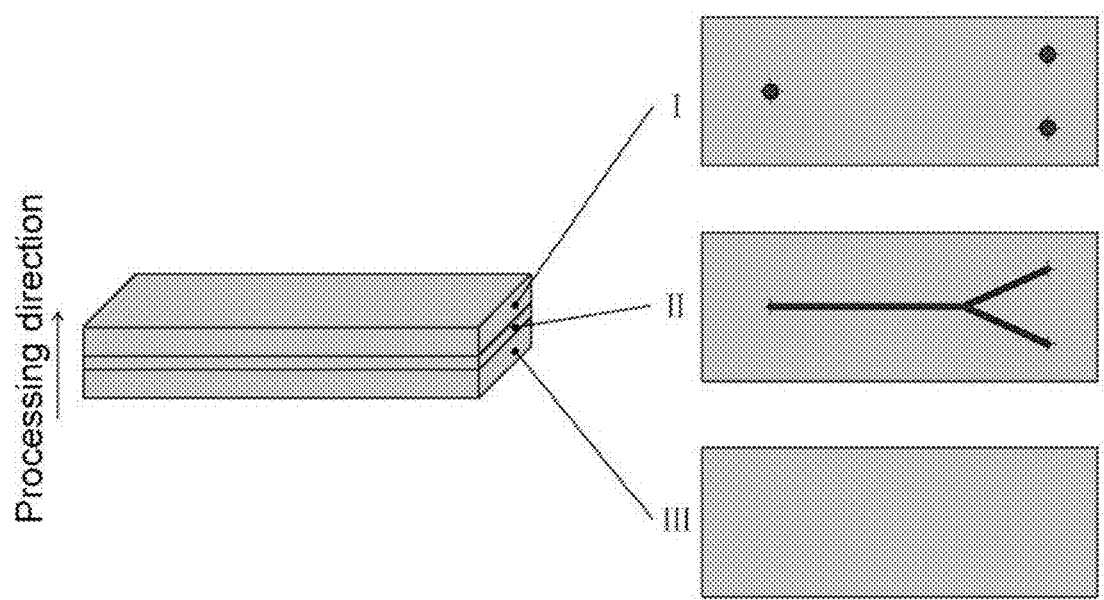
FIG. 7b shows a second schematic diagram of the layered processing of feature regions of the microfluidic chip model according to an embodiment of the present disclosure.

FIGS. 7a-7b schematically show a layered processing of a three-dimensional model of the microfluidic chip. According to the processing features of the microfluidic chip model, the program software layers the microfluidic chip model into three types of areas including the complex variable section micro-channel area, the simple fixed section micro-channel area and the non-processing feature area. As shown in FIG. 7a, the simple fixed section micro-channel area is defined as the I area, in which the micro-channels in the I area are longitudinal micro-channels, and different positions have the same sectional processing features. The complex variable section micro-channel area is defined as the II area, in which the micro-channels in the II area are mainly horizontal micro-channels, and also include micro-channels in various directions. Different positions have different sectional processing features. The non-processing feature area is defined as the III area, in which there is no microfluidic chip structure, and thus, the laser processing don't need to be performed. In particular, in the layered processing, there may be multiple regions of the same type. The complex variable section micro-channel area (the II area) needs to be further layered and sliced by software, and the complex variable section micro-channel area with a thickness of t in the microfluidic chip is sliced into a thin slice with a thickness of Δt, as shown in FIG. 7b. The processing process of the microfluidic chip adopts a bottom-up processing procedure with reference to the microfluidic chip model in FIGS. 7a-7b. The three-dimensional micro-nano processing platform is firstly controlled from the bottom surface of the microfluidic chip. There is no need to perform processing for the non-processing feature area (the III area), in which the Z-direction position of the three-dimensional micro-nano processing platform is controlled to quickly reach the lowest layered slice position of the complex variable section micro-channel area (the II area). By regulating the large-format array femtosecond laser interference for interference layered processing, the direct printing is performed layer by layer from bottom to top. When the processing proceeds to the lowest section of the simple fixed section micro-channel area (the I area), the large-format array femtosecond laser is selectively regulated to perform the continuous interference scanning processing at specific positions, manufacturing continuous micro-channels on the microfluidic chip by ablation.

Described above are preferred embodiments of the present disclosure, which are not intended to limit the disclosure. It should be understood that modifications and improvements made by those of ordinary skill in the art without departing from the spirit of the disclosure shall fall within the scope of the disclosure defined by the appended claims.

What is claimed is:

1. A method for direct printing of a microfluidic chip based on a large-format array femtosecond laser, comprising:
   (1) pre-amplifying a seed light followed by splitting the seed light through a pulse splitting device to form an m×n array laser; performing pre-amplification and pre-compression multiple times on each laser beam of the array laser; regulating a phase, a light intensity, a polarization, a center wavelength, and a pulse width of each laser beam of the array laser, respectively, to output the large-format array femtosecond laser;
   (2) allowing the large-format array femtosecond laser to pass through a reflecting mirror array element device; regulating a combination of laser beams to form a plurality of beam interference groups varying in the number of laser beams for large-format femtosecond laser interference; regulating a combination and an exposure method of each of the plurality of beam interference groups followed by superposition of multiple exposures to output a desired pattern, thereby enabling femtosecond laser interference direct printing processing of the microfluidic chip;
   (3) allowing the large-format array femtosecond laser to passes through the reflecting mirror array element device; regulating laser beams in a specific area to perform a selected-area interference at a specific position, to realize a femtosecond laser-based selected-area interference direct printing processing on the microfluidic chip, and an ablation processing in a selected area with a specific location and a specific feature;
   (4) subjecting the microfluidic chip to layering to divide the microfluidic chip into three types of feature areas comprising a complex variable section micro-channel area, a simple fixed section micro-channel area, and a non-processing feature area; and according to a feature of layered areas of the microfluidic chip from bottom to top, intelligently regulating processing methods to realize processing of the microfluidic chip; and
   (5) subjecting the microfluidic chip after direct printing to ultrasonic-assisted etching in a hydrofluoric acid solution to dredge micro-channels inside the microfluidic chip, thereby forming complex three-dimensional micro-channels on the microfluidic chip.

2. The method of claim 1, wherein in step (1), a delay, a light intensity, a polarization, a frequency doubling and a pulse compression of each laser beam of the array laser are regulated to output the large-format array femtosecond laser with controllable phase $\varphi$, light intensity I, polarization p, center wavelength $\Delta$, and pulse width $\tau$ as a light source for the direct printing processing on the microfluidic chip.

3. The method of claim 1, wherein a pulse width of each beam laser of the large-format array femtosecond laser modulated in step (1) is less than or equal to 200 fs, and a single pulse energy of each beam laser of the large-format array femtosecond laser is more than or equal to 10 $\mu$J; and a center wavelength of the large-format array femtosecond laser is 200-400 nm, 400-700 nm or 700-2500 nm.

4. The method of claim 1, wherein the interference direct printing processing in step (2) is performed by laser beam combined interference processing; the plurality of beam interference groups are formed in a processing area; and each of the plurality of beam interference groups adopts two or more femtosecond laser beams to perform interference or regulate exposure mode.

5. The method of claim 1, wherein in step (2), a regulation of a femtosecond laser state of each of the plurality of beam interference groups is enabled; a plurality of laser beams with different wavelengths are regulated to generate a linear interference effect and a nonlinear interference effect, thereby regulating interference cycle, interference spot size and interference pattern; and
   the regulation of the femtosecond laser state comprises regulations of the phase $\varphi$, the light intensity I, the polarization p, the center wavelength $\Delta$ and the pulse width $\tau$ of each beam laser in the large-format array femtosecond laser.

6. The method of claim 1, wherein in step (2), the combination and the exposure mode of each of the plurality of laser beam interference groups are regulated, and a state of each femtosecond laser beam in each of the plurality of laser beam interference groups is regulated, so that the desired pattern for processing of the microfluidic chip is output by controlling the superposition of multiple exposures, thereby realizing the interference direct printing processing of the microfluidic chip.

7. The method of claim 4, wherein a size of interference spot and a size of an interference array point of laser beams are regulated by the plurality of laser beam interference groups; a laser energy is controlled to make an energy at a peak of the interference array point reaches an ablation threshold of a material of the microfluidic chip; and a resolution of the peak of the interference array point is 0.1 $\mu$m.

8. The method of claim 1, wherein in step (3), laser beams in the specific area are regulated to produce interference to enable selected-area interference direct printing or selected-area interference ablation; and two or more femtosecond laser beams are adopted to perform interference to realize a regulation of an interference state of each femtosecond laser beam and a regulation of a size of an interference spot.

9. The method of claim 8, wherein in the selected-area interference direct printing processing, laser beams in the specific area are regulated to generate interference, and interference spots formed by the selected area interference form and output the desired pattern, to realize the interference direct printing processing of the microfluidic chip; and
the selected-area interference ablation enables selected-area processing of one or more longitudinal micro-channels on the microfluidic chip.

10. The method of claim 1, wherein in step (4), an interference layered processing and an interference continuous scanning processing are performed according to features of each processing area.

11. The method of claim 1, wherein in step (4), the complex variable section micro-channel area has a complex three-dimensional structure and sections have different features; the complex variable section micro-channel area is processed by interference layered direct printing processing; in the interference layered direct printing processing, a layered slice of the complex variable section micro-channel area needs to be determined according to a depth of focus of laser interference; a thickness of the layered slice is consistent with an ablation depth of laser interference ablation, wherein the thickness of the layered slice is 0-50 µm; the interference layered direct printing processing in the complex variable section micro-channel area is performed from bottom to up; an exposure time of processing of a single-layered slice is controlled according to processing requirements of the microfluidic chip, to manufacture a three-dimensional micro-channel structure with continuous intercommunication between layers; the interference layered direct printing processing is performed based on large-format array interference direct printing technology and large-format array selected-area interference processing technology.

12. The method of claim 1, wherein in step (4), the simple fixed section micro-channel area has a simple three-dimensional structure with sections having the same feature, and is processed by interference continuous scanning processing; in the interference continuous scanning processing, the array femtosecond laser is controlled to generate laser interference to perform ablation processing at a specific position; the interference continuous scanning processing for the simple fixed section micro-channel area is performed from bottom to up; a scanning speed is controlled according to a processing requirement of the microfluidic chip, to manufacture three-dimensional micro-channel structure by continuous ablation; and the interference continuous scanning processing is performed based on a large-format array selected-area interference processing technology.

13. The method of claim 1, wherein in step (5), the ultrasonic-assisted etching in the hydrofluoric acid solution is performed to post-process the microfluidic chip after the direct printing, to dredge micro-channels of the microfluidic chip.

14. A device for direct printing of a microfluidic chip based on a large-format array femtosecond laser, comprising:
an array laser configured for outputting the large-format array femtosecond laser;
an interference regulation system configured for regulating laser interference direct printing;
a processing platform configured for processing the microfluidic chip;
an imaging unit configured for monitoring a processing status in real time;
a control cabinet configured for implementing an integrated control of the device; and
a program software configured for model processing and signal encoding; wherein the large-format array femtosecond laser has controllable phase p, light intensity I, polarization p, center wavelength X and pulse width r; and wherein the interference regulation system is configured to perform an interference regulation on the large-format array femtosecond laser by regulating a laser interference state, an interference combination and an exposure mode, so that a plurality of exposures are superposed to output a desired direct printing pattern for a direct printing processing of the microfluidic chip in the processing platform; the program software is configured to preprocess a three-dimensional model of an imported microfluidic chip to be processed, and convert processing information obtained by processing and analysis into electrical signals and input the electrical signals into the control cabinet; the control cabinet is configured to control the direct printing process of the microfluidic chip through control signals; and the imaging unit is configured to monitor and record a real-time state of the direct printing processing of the microfluidic chip.

15. The device of claim 14, wherein the array laser is configured to output an m×n large-format array femtosecond laser beam, and regulate a phase $\varphi$, a light intensity I, a polarization p, a center wavelength $\lambda$, and a pulse width $\tau$ of each laser beam of the m×n large-format array femtosecond laser beam to output femtosecond lasers in different states;
the array laser comprises a seed light source, a pre-amplifier, a beam splitting device, a multi-stage pre-amplifier, a multi-stage pre-compressor, and a laser state control part; the seed light source is an energy source for processing; the pre-amplifier is configured to pre-amplify a seed light emitted from the seed light source; the beam splitting device is configured to split the pre-amplified seed light into an m×n array laser; the multi-stage pre-amplifier and the multiple-stage pre-compressor are configured to perform a multi-stage pre-amplification and a multi-stage pre-compression on each laser beam of the m×n array laser, respectively; the laser state control part is configured to regulate the phase $\varphi$, the light intensity I, the polarization p, the center wavelength $\lambda$, and the pulse width $\tau$ of each laser beam, and output the large-format array femtosecond laser in which states of laser beams are different and adjustable.

16. The device of claim 14, wherein the interference regulation system is configured to regulate an interference state of the large-format array femtosecond laser, regulate an interference of any number of laser beams at any position and regulate a combination and an exposure mode of laser beams;
the interference regulation system comprises a beam collimating device and a reflecting mirror array element device; the beam collimating device is configured to collimate laser beams of the large-format array femtosecond laser output by the array laser, and regulate a spot size of an output collimated laser; the reflecting mirror array element device is an array combination of m×n reflecting mirrors of which a reflecting direction is controllable in XY; and each reflecting mirror array element is configured to control a position of a corresponding laser spot on the microfluidic chip, so as to control a corresponding laser beam to perform interference.

17. The device of claim 14, wherein the processing platform is configured to realize positioning of a processing zero point of the microfluidic chip and a control of a processing depth in a Z direction;
the processing system comprises a working platform and a three-dimensional micro-nano platform; the working platform is configured for fixing the microfluidic chip to be processed; and the three-dimensional micro-nano platform is configured to regulate a XYZ position of the microfluidic chip to be processed according to the control signals.

18. The device of claim 14, wherein the imaging unit is configured to image and monitor a surface of the microfluidic chip processed by direct printing in real time;
the imaging unit comprises a high-speed camera imaging system and an auto-focusing system; the high-speed camera imaging system is configured to realize real-time monitoring and high-speed photographing of the surface of the microfluidic chip processed by direct printing; and the auto-focusing system is configured to realizes an auto focusing of the high-speed camera imaging system.

19. The device of claim 14, wherein the control cabinet is an integrated control system, which is configured to regulate the phase φ, the light intensity I, the polarization p, the center wavelength 2 and the pulse width τ of each laser beam in the large-format array femtosecond laser output by the array laser, regulate the reflecting mirror array element device in the interference regulation system, and regulate the three-dimensional micro-nano platform of the processing system.

20. The device of claim 14, wherein the program software is configured to provide integrated user-friendly analysis, control and monitor;
the program software comprises a model preprocessing module, a signal encoding module, a real-time display module, an image processing system and a simulation display module; the model preprocessing module is configured to perform a layered processing of feature regions according to a feature of the microfluidic chip to be processed, and perform a layered slicing processing on a complex variable section micro-channel region in the microfluidic chip to be processed; the signal encoding module is configured to perform a signal encoding on a processing feature of each feature region of a preprocessed microfluidic chip model, and obtain a processing signal, and import the processing signal into the integrated control system; the real-time display module is configured to realize a real-time display of a processing state of the microfluidic chip monitored by the high-speed camera imaging system; the image processing system is configured to process and analyze image signals acquired by the real-time display module, to realize online analysis and monitoring of processing quality of the microfluidic chip; and the simulation display module is configured to realize a simulation display of processing of the microfluidic chip according to an execution status of a processing program to monitor processing state and processing progress.

* * * * *